US006541830B1

United States Patent
Iyer

(10) Patent No.: US 6,541,830 B1
(45) Date of Patent: Apr. 1, 2003

(54) TITANIUM BORIDE GATE ELECTRODE AND INTERCONNECT

(75) Inventor: Ravi Iyer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 35 days.

(21) Appl. No.: 09/634,490

(22) Filed: Aug. 8, 2000

Related U.S. Application Data

(62) Division of application No. 08/916,275, filed on Aug. 22, 1997, now Pat. No. 6,156,630.

(51) Int. Cl.[7] .................. H01L 29/94; H01L 23/48; H01L 23/52
(52) U.S. Cl. .................. 257/412; 257/413; 257/751; 257/757
(58) Field of Search ................. 257/750–751, 257/754, 757, 412, 413

(56) References Cited

U.S. PATENT DOCUMENTS

| | | |
|---|---|---|
| 4,933,743 A | 6/1990 | Thomas et al. |
| 5,086,016 A | 2/1992 | Brodsky et al. |
| 5,117,276 A | 5/1992 | Thomas et al. |
| 5,173,327 A | 12/1992 | Sandhu et al. |

(List continued on next page.)

FOREIGN PATENT DOCUMENTS

| | | |
|---|---|---|
| JP | 3-61152076 A | 7/1986 |
| JP | 2-58874 | 2/1990 |
| JP | 4-02058874 A | 2/1990 |
| JP | 4-03163875 A | 7/1991 |
| JP | 6-132286 | 5/1994 |
| JP | 4-06132286 A | 5/1994 |

OTHER PUBLICATIONS

Choi et al., "Optimization and characterization of LPCVD TiB(sub2) for ULSI applications," *J. Electrochem. Soc.,* 138(10):3053–3061 (Oct. 1991).

Choi et al., "Stability of TiB(sub2) as a diffusion barrier on silicon," *J. Electrochem. Soc.,* 138(10):3062–3067 (Oct. 1991).

Choi et al., "Transactions on Electron Devices," *IEEE,* 39:2341–2345 (1992).

Pelleg et al., "Titanium silicide formation in TiSi(sub2)/TiB(sub2) bilayer barrier layer structure," *Microelectronic Engineering,* 33(1–4):317–323 (Jan. 1997).

(List continued on next page.)

*Primary Examiner*—Richard Booth
(74) *Attorney, Agent, or Firm*—Mueting, Raasch & Gebhardt, P.A.

(57) ABSTRACT

A method for use in the fabrication of a gate electrode includes providing a gate oxide layer and forming a titanium boride layer on the oxide layer. An insulator cap layer is formed on the titanium boride layer and thereafter, the gate electrode is formed from the titanium boride layer. A barrier layer may be formed on the oxide layer prior to forming the titanium boride layer with the gate electrode being formed from the barrier layer and the titanium boride layer. Further, a polysilicon layer may be formed on the gate oxide layer prior to forming the titanium boride layer with the gate electrode being formed from the titanium boride layer and the polysilicon layer. Yet further, a polysilicon layer may be formed on the gate oxide layer and a barrier layer formed on the polysilicon layer prior to forming the titanium boride layer. The gate electrode is then formed from the polysilicon layer, the barrier layer, and the titanium boride layer. Similar methods can further be used in the formation of interconnects to connect contact regions. Gate electrode structures and interconnect structures resulting from the methods are also described. Further, in such methods and structures, the titanium boride layer may be a titanium diboride layer or a titanium boride layer having silicon incorporated therein.

11 Claims, 8 Drawing Sheets

U.S. PATENT DOCUMENTS

| | | |
|---|---|---|
| 5,210,431 A | 5/1993 | Kimoto et al. |
| 5,330,921 A | 7/1994 | Yoshida et al. |
| 5,439,833 A | 8/1995 | Herbert et al. |
| 5,721,175 A | 2/1998 | Kunishima et al. |
| 5,745,990 A | 5/1998 | Lee et al. |
| 5,827,762 A | 10/1998 | Bashir et al. |
| 5,858,873 A | 1/1999 | Vitkavage et al. |
| 5,882,992 A | 3/1999 | Kobeda et al. |
| 5,898,221 A | 4/1999 | Mizuhara et al. |
| 5,911,114 A | 6/1999 | Naem |
| 5,913,139 A | 6/1999 | Hashimoto et al. |
| 5,918,145 A | 6/1999 | Rodder |
| 5,981,372 A | 11/1999 | Goto et al. |
| 5,985,713 A | 11/1999 | Bailey |
| 5,990,513 A | 11/1999 | Perino et al. |
| 5,994,730 A | 11/1999 | Shrivastava et al. |

OTHER PUBLICATIONS

Sade et al., "Sputter deposition and characterization of $TiB_2/TiSi_2$ bilayer contact structure," *MAM 97—Materials for Advanced Metalization Poster Session II*, pp. 210–212 (1997).

Williams, "Plasma enhanced chemical vapor deposition of titanium boride films," *APL*, *46*(1):43–45 (Jan. 1985).

TITANIUM BORIDE GATE ELECTRODE AND INTERCONNECT

This is a division of Ser. No. 08/916,275, filed, now Aug. 22, 1997, U.S. Pat. No. 6,156,630.

FIELD OF THE INVENTION

This invention relates to semiconductor fabrication methods and structures resulting from such methods. More particularly, the present invention relates to gate electrode structures and interconnects containing titanium boride and methods for forming such structures.

BACKGROUND OF THE INVENTION

Metal Oxide Semiconductor (MOS) devices are widely used in integrated circuit devices. Such MOS devices may include memory devices which are comprised of an array of memory cells. Each memory cell is comprised of a capacitor, on which the charge stored represents the logical state of the memory cell. Conductors, referred to as word lines, serve as gate electrodes of multiple access transistors which provide access to the memory cells. In a DRAM (Dynamic Random Access Memory), a word line gate electrode typically is fabricated on a p-type silicon substrate coated with a thin film of silicon dioxide, known as the gate oxide. Word lines conventionally are formed on the gate oxide layer as a two-layer stack, typically including polysilicon and a conductor material such as tungsten silicide or titanium silicide (commonly referred to as a polycide word line). Further, polycide structures are also used for local interconnects in MOS devices. For example, such polycide structures may be used or the local interconnection of gates and drains in a SRAM (Static Random Access Memory).

Minimizing resistivity throughout the word line or other interconnect structures is of importance to meet the need of reducing time constants and allowing access of memory cells in as short a time period as possible. As memory density increases, feature sizes, including line sizes, decrease. For example, when the feature size of a conductor, such as a local interconnect or a word line, is reduced in a high density memory, the resistance of the conductor increases. Thin tungsten silicide and titanium silicide are larger grain materials that contribute to a very rough silicide/silicon interface. As such, it reduces the effective ohmic contact area. Therefore, it is desirable to utilize conductors whose resistivity will not significantly increase for the same feature dimensions.

Further, in the fabrication of semiconductor devices, it is desirable to find conductors which are suitable for use at high temperatures (e.g., up to a out 1100° C.) during processing steps. Particularly desirable are materials which have low bulk resistivities and good oxidation resistance at high temperatures. However, such materials can be difficult to find, and, once found, difficult to form by conventional methods. Further, other problems may occur with such materials, such as, for example, diffusion of atoms from one layer to another, particularly at high processing temperatures. Such diffusion is particularly undesirable if the properties of one layer are changed because of diffusing atoms.

It has been reported in the article by Choi et al., "Electrical Characteristics of $TiB_2$ for ULSI Applications," IEEE Transactions on Electron Devices, Vol. 39, No. 10 (October 1992) that titanium diboride may be used as a diffusion barrier in metallization applications.

In view of the above, there is a need for low resistivity material for use in gate electrode and interconnect applications. The present invention provide gate electrode structures and interconnect structures which overcome the disadvantages described above, along with other problems as will be apparent from the description below.

SUMMARY OF THE INVENTION

A method for use in the fabrication of a gate electrode according to the present invention includes providing a gate oxide layer and forming a titanium boride layer on the oxide layer. An insulator cap layer is formed on the titanium boride layer and thereafter, the gate electrode is formed from the titanium boride layer.

In one embodiment of gate electrode formation method, a barrier layer is formed on the oxide layer prior to forming the titanium boride layer. The barrier layer is formed of a material selected from refractory suicides and refractory nitrides. Further, the gate electrode is formed from the barrier layer and the titanium boride layer.

In another embodiment of the gate electrode formation method, a polysilicon layer is formed on the gate oxide layer prior to forming the titanium boride layer. The gate electrode is then formed from the titanium boride layer and the polysilicon layer.

In yet another embodiment of the gate electrode formation method, a polysilicon layer is formed on the gate oxide layer and a barrier layer is formed on the polysilicon layer prior to forming the titanium boride layer. The barrier layer is formed of a material selected from refractory silicides and refractory nitrides. Further, the gate electrode is formed from the polysilicon layer, the barrier layer, and the titanium boride layer.

A method for use in the formation of an interconnect in the fabrication of integrated circuits is also described. The method includes providing a substrate assembly including at least two contact regions. A titanium boride layer is formed on the substrate assembly. The interconnect is then formed from the titanium boride layer to connect the at least two contact regions.

In one embodiment of the interconnect formation method, a polysilicon layer is formed on the substrate assembly prior to forming the titanium boride layer. The interconnect is then formed from the titanium boride layer and the polysilicon layer.

In another embodiment of the interconnect formation method, the method includes forming a barrier layer on the substrate assembly prior to forming the titanium boride layer. The barrier layer is formed of a material selected from refractory silicides and refractory nitrides. Further, the interconnect is then formed from the barrier layer and the titanium boride layer.

In yet another embodiment of the interconnect formation method, a polysilicon layer is formed on the substrate assembly and a barrier layer is formed on the polysilicon layer prior to forming the titanium boride layer. The barrier layer is formed of a material selected from refractory suicides and refractory nitrides. Further, the interconnect is then formed from the polysilicon layer, the barrier layer, and the titanium boride layer.

A method of depositing a titanium boride layer for use in the fabrication of integrated circuits according to the present invention includes providing a chemical vapor deposition reaction chamber containing a substrate assembly. Reactive compounds of titanium, boron and silicon are provided in the reaction chamber. A titanium silicide boride layer is then formed on the substrate assembly by chemical vapor deposition.

A gate electrode structure according to the present invention includes a substrate assembly having a gate oxide region formed thereon. A titanium boride region is formed on the gate oxide region and a cap region is formed on the titanium boride region.

In one embodiment of the gate electrode structure, the a polysilicon region is formed between the gate oxide region and the titanium boride region.

In another embodiment of the gate electrode structure, a barrier region is formed between the polysilicon region and the titanium boride region. The barrier region is formed of a material selected from refractory silicides and refractory nitrides.

In yet another embodiment of the gate electrode structure, a barrier region is formed between the gate oxide region and the titanium boride region. The barrier region is formed of a material selected from refractory silicides and refractory nitrides.

An interconnect structure according to the present invention is also described. The structure includes a substrate assembly including at least two contact regions. A titanium boride region is formed on the substrate assembly connecting the at least two contact regions.

In one embodiment of the interconnect structure, a polysilicon region is formed between the substrate assembly and the titanium boride region.

In another embodiment of the interconnect structure, a barrier region is formed between the polysilicon region and the titanium boride region. The barrier region is formed of a material selected from refractory suicides and refractory nitrides.

In yet another embodiment of the interconnect structure, a barrier region is formed between the substrate assembly and the titanium boride region. The barrier region is formed of a material selected from refractory suicides and refractory nitrides.

In the methods and structures generally described above, the titanium boride layer may be a titanium diboride layer or a titanium boride layer having silicon incorporated therein.

DETAILED DESCRIPTION OF THE EMBODIMENTS

Figure 1:
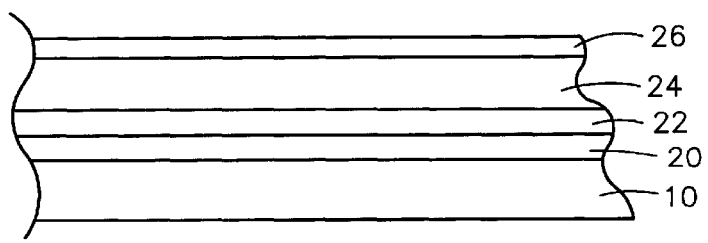
FIG. 1 is an illustrative diagram of one embodiment in accordance with the present invention showing layers formed on a substrate assembly.

The present invention shall be generally described with reference to FIGS. 1–9. With the description as provided below, it is readily apparent to one skilled in the art that the various processes described with reference to the figures may be utilized in various configurations. For example, the present invention may be used in the formation of word lines, bit lines, local interconnects, etc. for various memory circuits. Further, for example, the present invention may be particularly beneficial in the fabrication of word line gate electrodes of DRAM's or for local interconnects of SRAM's.

In this application, "semiconductor substrate" refers to the base semiconductor layer, e.g., the lowest layer of silicon material in a wafer or a silicon layer deposited on another material such as silicon on sapphire. The term "semiconductor substrate assembly" refers to the semiconductor substrate having one or more layers or structures formed thereon. When reference is made to a substrate assembly in the following description, various process steps may have been previously utilized to form regions/junctions in the semiconductor substrate thereof. It should be apparent that scaling in the figures does not represent precise dimensions of the various elements illustrated therein.

As described in further detail with reference to FIG. 1, an optional doped polysilicon layer 20, optional barrier layer 22, titanium boride layer 24 and an insulator cap layer 26 are deposited sequentially over the substrate assembly 10. The stack may be formed on any semiconductor substrate or substrate assembly. For example, the underlayer over which the stack is formed (i.e., the upper portion of the substrate assembly 10) may be a gate oxide for forming a word line gate electrode as further described herein or may include an oxide and/or a silicon containing region in the formation of a local interconnect.

As indicated above, and as further shown in the illustrative embodiment of FIG. 8, the underlying layer, i.e., the upper region of the substrate assembly 10 may be a gate oxide layer. The gate oxide layer may be formed, for example, by thermal oxidation of silicon. The gate oxide is typically a thin layer, e.g., about 40Å to about 150Å. In general, the gate oxide functions as a dielectric whose thickness is chosen specifically to allow induction of a charge in the gate region.

If used, the optional layer of polysilicon 20 may be formed on the substrate assembly 10 by any known method for forming such a polysilicon layer. For example, polysilicon layer 20 may be formed by the pyrolitic decomposition of a silane at temperatures ranging from about 550° C. to about 650° C. Preferably, he polysilicon layer ranges in thickness from about 200 Å to about 2000 Å. The polysilicon layer 20 is a polycrystalline layer of silicon which is doped with, for example, phosphorous (i.e., to form n+ doped Si), such as by ion implantation.

Figure 3:
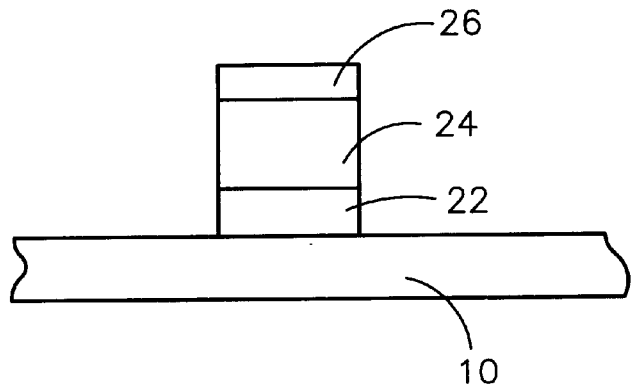
FIG. 3 is an illustrative diagram of an alternative embodiment of the present a invention showing layers formed on a substrate assembly after patterning.

If used, the optional barrier layer 22 is formed over the polysilicon layer 20 (or over the substrate assembly 10 as shown in FIG. 3). The optional barrier layer 22 includes a refractory silicide or refractory nitride formed by any known method for forming the particular desired silicide or nitride. For example, a refractory metal is first deposited by sputtering, evaporation, or chemical vapor deposition (CVD). The desired silicide or nitride is obtained by controlling reaction conditions as is known to one skilled in the art. For example, when metal deposition is followed by annealing in a nitrogen atmosphere, a metal nitride is produced. Alternatively, for example, depending on the temperature of the annealing step, the metal reacts with silicon in adjacent layers (e.g., the polysilicon layer) to form a silicide. Further, for example, the silicide may be sputtered from a silicide target. Suitable refractory metals to produce such silicides or nitrides include but are not limited to cobalt, nickel, tungsten, tantalum, and titanium, resulting in, for example, WSiN, TaN, $WSi_2$, TiN, $TiSi_2$, $CoSi_2$, and MN. As indicated in the resulting nitrides and silicides, the barrier layer may also be a refractory silicide nitride resulting from various known processes. The optional barrier layer 22 ranges in thickness from about 25 Å to about 500 Å, preferably the thickness ranoes from about 25 Å to about 200 Å. The optional barrier layer 22 is used to retard interdiffusion and resist the tendency for chemical reactions to form new phases between adjoining materials which the barrier separates. For example, the diffusion barrier layer 22 retards diffusion of boron from the titanium boride layer into adjacent layers.

The titanium boride layer 24 is then formed via chemical vapor deposition (CVD) processing. For example, the titanium boride layer 24 may be formed with use of a thermal CVD process or via a plasma CVD process in which compounds containing titanium and boron react in the gas phase. The titanium boride layer 24 may be any layer including titanium and boron. Preferably, the titanium boride layer 24 is substantially stoichiometric titanium diboride ($TiB_2$) or the titanium boride layer 24 may be $TiSi_xB_y$, where x is in the range of 0 to about 0.2 and y is in the range of about 1.8 to 2.0. The presence of silicon is believed to enhance the oxidation resistance of the titanium boride layer 24 at elevated temperatures.

The titanium boride layer 24 preferably ranges in thickness from about 200 Å to about 3000 Å. However, the thickness of the titanium boride layer 24 depends on the ultimate desired application of the layer because the thickness corresponds to the resistivity of the layer. For example, for a gate electrode, the titanium boride layer may have a thickness of about 300 Å to about 3000 Å, and for use in a local interconnect the thickness may be in the range of about 500 Å to about 2000 Å.

The CVD processes used to deposit the titanium boride layer 24 described in further detail below. Generally, as further described below, the source for the titanium is a titanium halide, the source for the boron is a borane, and the source of silicon in the CVD process is a gaseous silane.

Finally, an optional cap layer 26 is formed on the titanium boride layer 24. The optional insulator cap layer 26 is preferably an oxide or a nitride which is formed in accordance with known methods for forming such layers. For example, the cap layer may be formed by CVD, thermal oxidation, or by any other known method. In the fabrication of a word line gate electrode, the cap layer 26 is typically used. On the other hand, in the fabrication of a local interconnect, the cap layer 26 may not be used. Further, in the fabrication of a word line gate electrode, the cap layer 26 is an insulating layer, such as, for example, silicon nitride, $SiO_xN_y$, or an oxide, such as, for example, BPSG, silicon dioxide, TEOS, etc. The optional cap layer 26 is formed on the titanium boride layer 24 and ranges in thickness, preferably from about 200 Å to about 3000 Å.

After the cap layer 26 has been formed, the layered structure shown in FIG. 1 is patterned and etched as required for the desired application. First, a photoresist is coated onto the cap layer 26 and patterned using photolithographic techniques known in the art. For example, ultraviolet radiation may be passed through a mask so that a desired pattern is imaged on the photoresist. This causes changes in the solubility of the exposed areas of the photoresist, such that after development with a suitable solvent, a desired pattern is fixed on the structure. The photoresist may then be baked to enable it to withstand subsequent processing. The above process results in a patterned photoresist mask.

Once the patterned mask is formed, the structure to be formed can be etched by methods known in the art and selected to produce the best results with the layers used in the structure. The etching is preferably performed by dry etching techniques. Endpoint detection can be accomplished by techniques known in the art, such as with optical or chemical endpoint detection. For example, the cap layer maybe etched with fluorine chemistry, the titanium boride layer may be etched with a chlorine chemistry in a reactive ion chamber, and the polysilicon may be etched with a chlorine and hydrogen bromide chemistry. It should be apparent to one skilled in the art that any known etching techniques suitable for etching the particular layers may be used in accordance with the present invention. After completion of etching one or more of the desired layers to result in the desired structure, the photoresist is removed by, for example, an oxygen ash or an ozone plasma.

Figure 2:
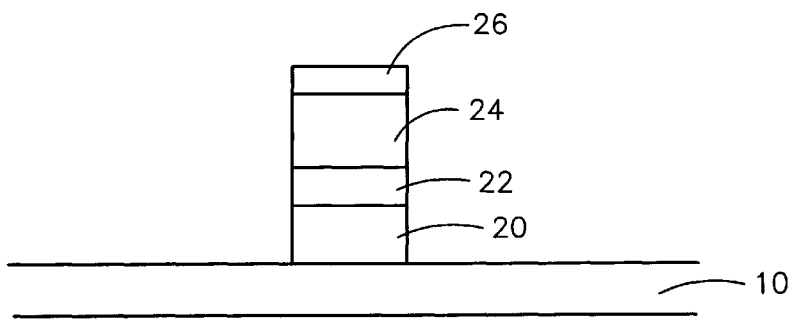
FIG. 2 is an illustrative diagram of the layers shown in FIG. 1 patterned in accordance with the present invention.

FIG. 2 illustrates the results after patterning and etching for one embodiment of the invention. In this embodiment, a cap layer 26, titanium boride layer 24, barrier layer 22, and polysilicon layer 20 are used and such layers are etched down to the substrate assembly 10, e.g., such as to a gate oxide layer, to form a gate electrode structure.

FIG. 3 illustrates another embodiment of the invention after patterning and etching. In this embodiment, a cap layer 26, titanium boride layer 24, and optional barrier layer 22 are used and are etched down to the substrate assembly 10 to form a structure for use in the fabrication of an integrated circuit, e.g., an interconnect, a gate electrode, etc. For example, the cap layer 26 may have a thickness in the range of about 500 Å to about 3000 Å, the titanium boride layer 24 may have a thickness in the range of about 300 Å to about 2000 Å, and the optional barrier layer 22 may have a thickness in the range of about 100 Å to about 300 Å.

Figure 4:
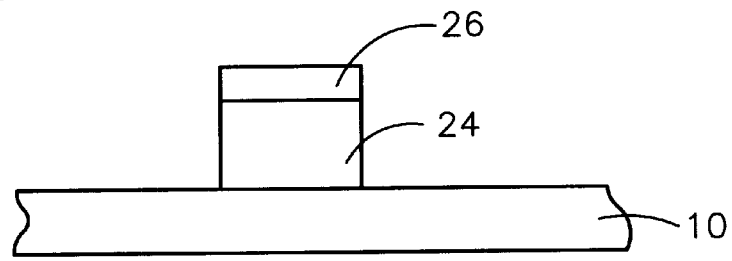
FIG. 4 is an illustrative diagram of another alternative embodiment of the present invention showing layers formed on a substrate assembly after patterning.

FIG. 4 illustrates yet another embodiment of the invention after patterning and etching. In FIG. 4, a cap layer 26 and titanium boride layer 24 are used and are etched down to the substrate assembly 10 to form the desired structure. For example, the cap layer 26 may have a thickness in the range of about 500 Å to about 3000 Å and the titanium boride layer 24 may have a thickness in the range of about 300 Å to about 2000 Å. In this embodiment, a barrier layer is not used indicating that diffusion of boron into adjacent layers is not always problematic. Thus, a barrier layer is not always necessary when forming the structures described herein.

Figure 5:
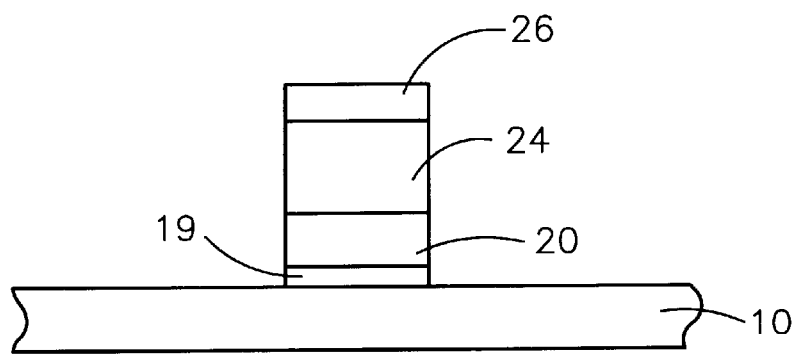
FIG. 5 is an illustrative diagram of yet another alternative embodiment of the present invention showing layers on a substrate assembly after patterning.

FIG. 5 illustrates yet another embodiment of the invention after patterning and etching. As shown in FIG. 5, a cap layer 26, titanium boride layer 24, and polysilicon layer 20 are used and are etched down to the substrate assembly 10 having a gate oxide layer 19 to obtain the desired structure, e.g., a gate electrode. For example, the cap layer 26 may have a thickness in the range of about 500 Å to about 3000 Å, the titanium boride layer 24 may have a thickness in the range of about 300 Å to about 2000 Å, the polysilicon layer 20 may have a thickness in the range of about 500 Å to about 2000 Å, and the gate oxide 19 may have a thickness in the range of about 40 Å to about 150 Å.

Figure 6:
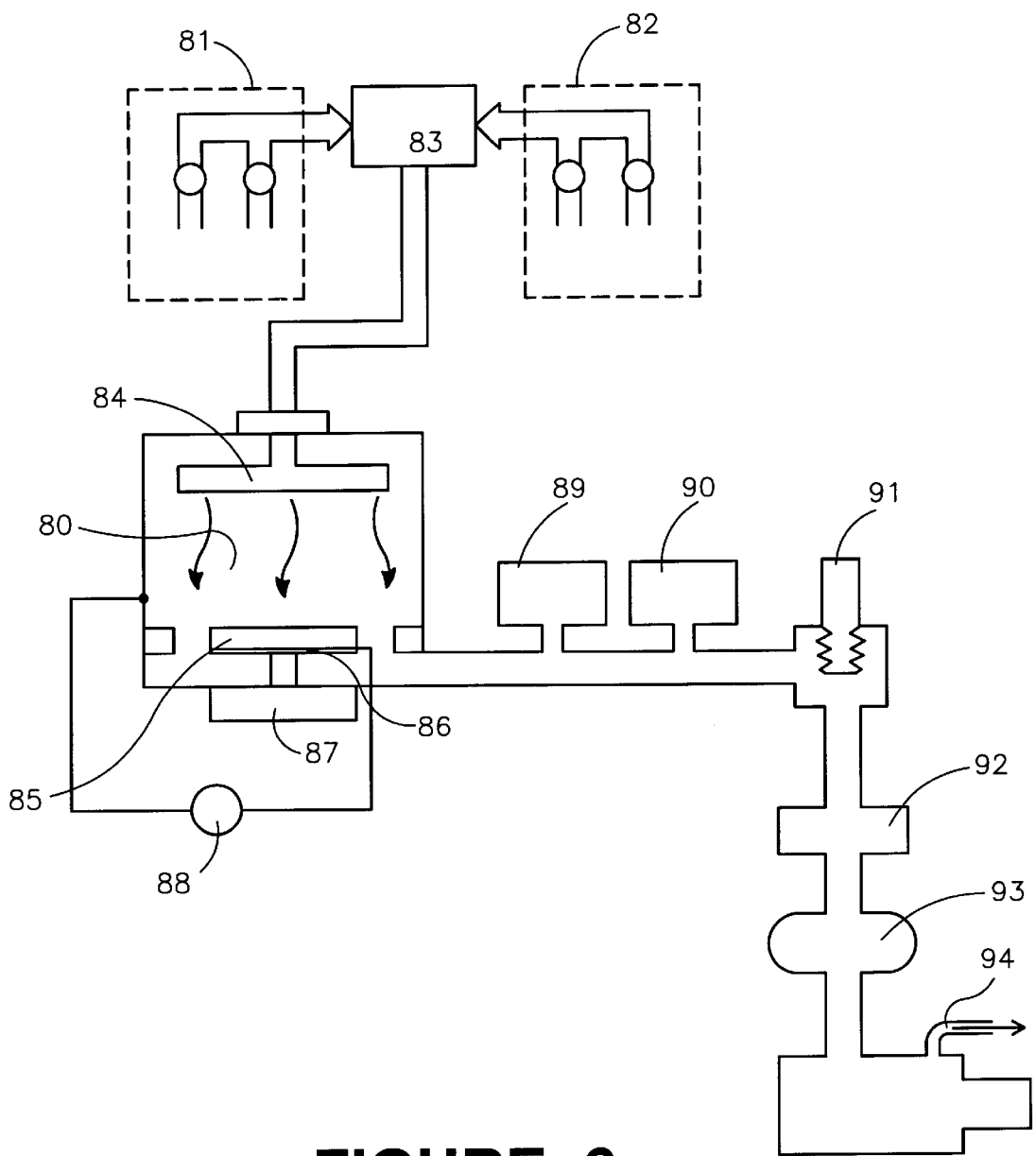
FIG. 6 is a general schematic illustration of a chemical vapor deposition system.
Figure 7:
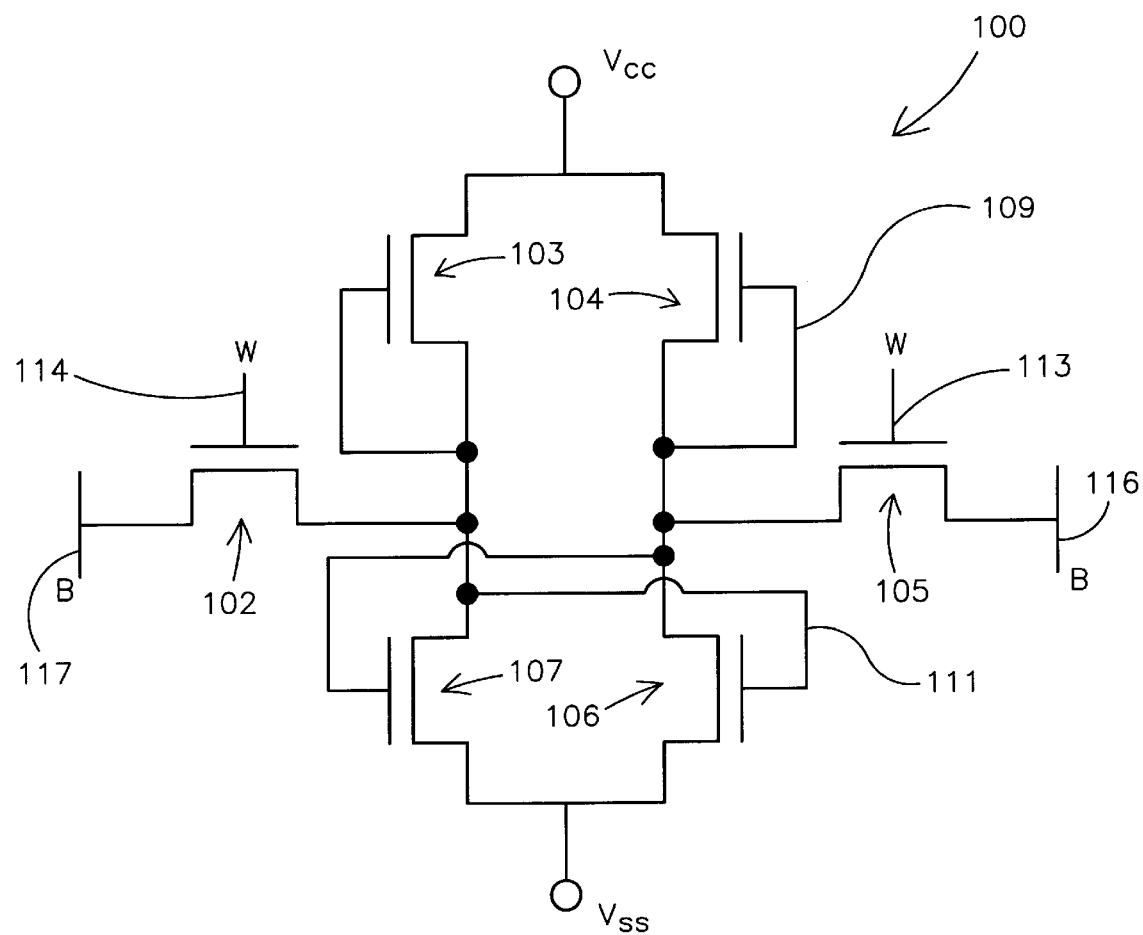
FIG. 7 is a general schematic illustration of a memory circuit of which gate electrodes and interconnects can be formed in accordance with the present invention.

FIG. 6 shows a CVD system which is to be taken as a general illustration representative of both a thermal CVD system and a plasma CVD system which may be used in accordance with the present invention. As would be apparent to one skilled in the art, the thermal system would not use components needed for generating a plasma in the reaction chamber. With reference to FIG. 6, the formation of the titanium boride layer 24 shall be described.

In the practice of the present invention, suitable titanium containing and boron containing compounds are chosen which will react to form titanium diboride, or, for the formation of TiSi$_x$B$_y$, such suitable titanium and boron containing compounds and further a silicon containing reactant is chosen for reaction in the reaction chamber. Suitable titanium containing compounds include titanium compounds which are volatile at room temperature or when heated, such as titanium halides. A preferred titanium compound is titanium tetrachloride. Suitable boron-containing compounds include borane compounds of the formula B$_n$H$_{n+4}$, such as B$_2$H$_6$ (diborane). The dihydroboranes, of formula B$_n$H$_{n+6}$, may also be suitable for practice this invention. Suitable silicon containing compounds include silanes such as SiH$_4$ and Si$_2$H$_6$.

For example, titanium diboride (TiB$_2$) may be deposited by either a thermal or plasma CVD process according to the following reaction:

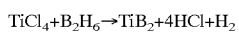
$$TiCl_4 + B_2H_6 \rightarrow TiB_2 + 4HCl + H_2$$

Optionally, silicon may be incorporated into the titanium boride. This is performed by introducing a silane into the reaction mixture. With the introduction of a silane into the reaction mixture, titanium silicide boride forms according to the following reaction:

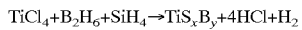
$$TiCl_4 + B_2H_6 + SiH_4 \rightarrow TiS_xB_y + 4HCl + H_2$$

The amount of silicon in the titanium boride layer increases its bulk resistivity, which is usually not desirable. However, this undesirable characteristic is offset by an increase in the oxidation resistance of this layer at high temperatures. The oxidation resistance is particularly beneficial for subsequent processing. For example, such oxidation resistance is beneficial when the structure including titanium silicide boride is part of a gate electrode structure subjected to reoxidation of source and drain.

For either thermal CVD or plasma enhanced CVD processes, the reactive compounds are admitted as gases into the reaction chamber which is at low pressure (i.e., low compared to ambient pressure). The reaction chamber is evacuated by means of vacuum pumps to remove undesirable reactive species, such as oxygen. Then, carrier gas and reactive compounds are admitted into the chamber. This is accomplished by one of various techniques. For example, the introduction into the chamber may be accomplished with the use of compounds which are gases at room temperature or by heating a volatile compound and bubbling a gas through it to carry it into the reaction chamber. It should be readily apparent that the techniques used for introduction of the compounds into the chamber may be varied and that the present invention is not limited to any particular technique.

For example, in accordance with the present invention, a volatile compound containing titanium (e.g., TiCl$_4$) is heated and/or a carrier gas such as argon or helium is used to bubble through the titanium compound and introduce the compound into the reaction chamber. In furtherance of this example, an inert gas, such as argon or helium, is bubbled through titanium chloride at a rate of about 20 sccm to about 500 sccm (standard cc/min). A boron containing compound (e.g., B$_2$H$_6$) is admitted into the reaction chamber at a flow rate ranging from about 20 sccm to about 1000 sccm. Typically, the reactive gases are admitted at separate inlet ports. In addition to the reactive compound, a dilution gas is flowed into the chamber. For example, argon may be flowed through the chamber at a flow rate ranging from about 100 sccm to about 10,000 sccm. The dilution gas, such as argon, serves as a carrier pas, to dilute reactant gases, to help control the desired deposition pressure, and to assist in removing reaction by-products from the reaction chamber. The temperature in the reaction chamber during the reactive deposition ranges from about 300° C. to about 800° C. depending on the type of CVD used. For example, for thermal CVD, the temperatures will be at the higher end of the range, e.g., about 500° C. to about 800° C., and for the plasma CVD process, the temperature range will be somewhat lower, e.g., about 300° C. to about 700° C. The pressure of the reaction chamber preferably ranges from about 0.5 torr to about 10 torr.

The reaction of the titanium containing compounds and boron containing compounds is carried out for a time sufficient to deposit the desired thickness of the titanium diboride layer on the underlying surface. The reaction conditions for the deposition of titanium silicide boride are substantially the same as those described above for titanium diboride, except that a silane is admitted into the reaction chamber at a flow rate of about 10 sccm to about 500 sccm.

In plasma enhanced CVD, a plasma is created by applying an electric field across the gas mixture containing the carrier gas and reactants. The plasma adds energy to the reaction to drive the reaction to completion. Generally, use of a plasma process allows the substrate assembly to be kept at a somewhat lower temperature than other CVD processes which is a processing advantage. For example, the temperatures are preferably in the range of about 300° C. to about 700° C.

Any suitable power source may be used to generate the plasma in the reaction chamber. Suitable power sources include an RF generator, a microwave (e.g., 2.5 GHz microwave source) generator, or an electron cyclotron resonance (ECR) source. A preferred power source is an RF generator operating as a standard 13.56 MHz source. The RF power preferably ranges from about 100 watts to about 5 kilowatts.

As generally shown in FIG. 6 for illustrative purposes only, in plasma enhanced CVD, gaseous reactants 81 and 82 enter the reaction chamber 80 through controller and shower head 84. For example, in the deposition of titanium diboride the reactants would include a titanium containing compound and a boron containing compound as previously described. Further, for example, in the deposition of titanium silicide boride, the reactants would further include a silicon containing compound. An RF generator 88 supplies power between the substrate holder 86 and the reaction chamber 80, thus creating a plasma in the region above the wafer 85. The reactant gases begin to react inside the reaction chamber 80 as they are absorbed at the heated surface of the substrate wafer 85. The wafer 85 is heated by convection from substrate holder 86 (such as graphite or alumina) that is heated to a preferred temperature of, for example, about 300° C. to about 800° C. via a lamp source 87. A chemical reaction occurs, thereby depositing a layer of titanium boride on the surface of the wafer 85. The reaction is enhanced by the presence of the plasma, which serves to increase the deposition rate. A constant deposition pressure between about 0.5 torr and 10 torr is monitored and maintained by conventional pressure control components; i.e., pressure sensor 89, pressure switch 90, air operating vacuum valve 91 and pressure control valve 92. The reaction by-product, HCl, and carrier gas pass through particulate filter 93 and escape through exhaust vent 94.

In a thermal CVD process, gaseous reactants and carrier gas are admitted into a reaction chamber typically via separate inlet ports. FIG. 8 is also useful in understanding the thermal CVD process, except that in thermal CVD, there is no power generator 88 and therefore no plasma during the deposition. The reaction chamber 80 is at reduced pressure (preferably, about 0.5 torr to about 10 torr). The substrate is heated to a temperature of about 300° C. to about 800° C. Reaction takes place on or near the surface of a substrate assembly, e.g., wafer, forming the desired layer of material, e.g. titanium silicide boride. Carrier gas assists the movement of reactive gases through the chamber and of by-products out of the chamber. The reaction is carried out for the time sufficient to deposit the desired thickness of the titanium boride layer on the underlying surface.

The processes described above are particularly useful for fabrication of word line gate electrodes and local interconnect applications, such as for DRAMs and SRAMs. For example, as shown in schematic illustration of a memory circuit 100 (FIG. 7), various portions of the circuit may be fabricated using the processes described above. The memory circuit 100 includes six transistors 102–107 connected in various manners to other elements such as with strap lines 109 and 111. Further, the schematic illustration shows word line gate electrodes at reference numbers 113 and 114 with bit line connections at reference numbers 116 and 117. It should be readily apparent from the description above and the description to follow that any number of the connections or structures necessary for providing a circuit, such as circuit 100, can be advantageously formed using the methods as described herein. For example, the processes are beneficial for providing the strap lines 109 and 111 for connection of the gate electrode to source/drain regions, for providing word line gate electrode 113 and 114, or for providing other structures such as buried digit lines or any other structure requiring low resistive material capable of withstanding oxidation conditions.

FIGS. 8 and 9 generally show the processes used in several illustrative embodiments. However, it should be readily apparent to one skilled in the art that the processes described above can be used for various other applications. Therefore, it is recognized that the following embodiments are for illustration only and not to be read as unduly limiting to the scope of the present invention.

Figure 8A:
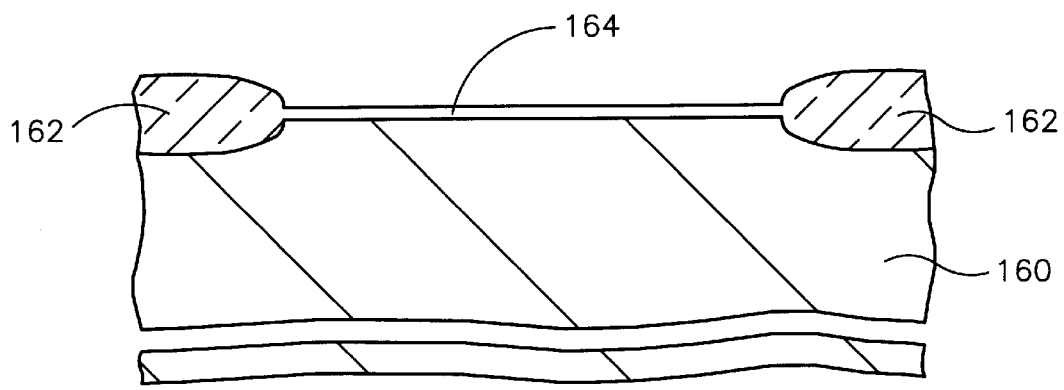
FIGS. 8A–8C are illustrative diagrams showing use of the present invention in the fabrication of a word line gate electrode.
Figure 8B:
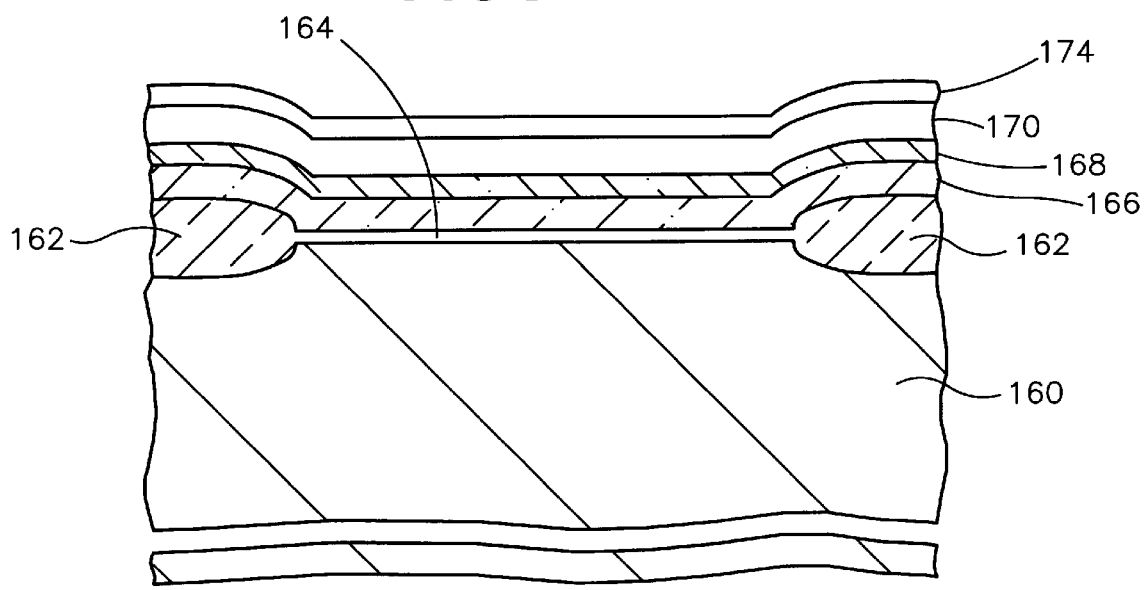
Figure 8C:
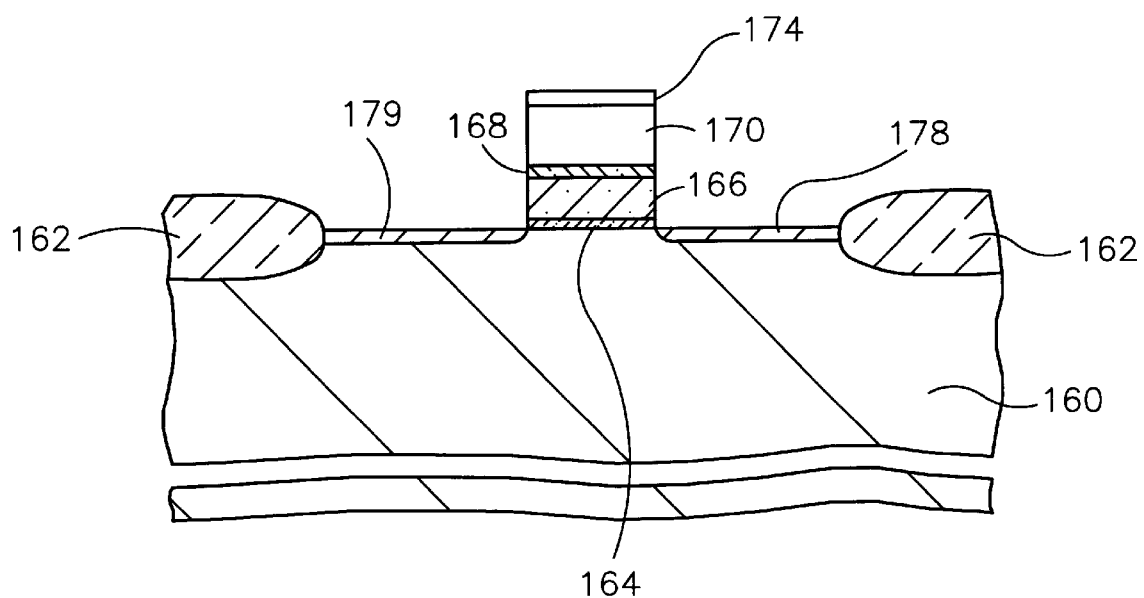

FIGS. 8A–8C illustrate fabrication of a word line gate electrode (FIG. 8C) in a memory device. FIG. 8A includes field oxide regions 162 formed (In substrate 160 such as, for example, by conventional local oxidation of silicon (LOCOS) processing. Further, a gate insulating layer, i.e., a gate oxide 164, is formed on semiconductor substrate 160 in the active area formed by field oxide regions 162. Semiconductor substrate 160 refers to the base semiconductor layer, e.g., a base layer of silicon material of the device or wafer or a silicon layer formed on another material such as silicon on sapphire.

As shown in FIG. 8B, a layer of polysilicon 166 is formed over the field oxide regions 162 and gate oxide 164. The polysilicon layer 166 can be formed by any conventionally known method, such as by chemical vapor deposition of by growth of polysilicon. A barrier layer 168 is then formed over the polysilicon layer 166. Thereafter, as previously described herein, a layer of titanium boride 170 and a cap layer 174 are formed sequentially over the barrier layer 168. Thereafter, as generally described herein, the polysilicon layer 166, the barrier layer 168, the titanium boride layer 170 and the cap layer 174 are patterned resulting in the gate electrode structure at least in part over the gate oxide 164 in the active area of the memory device as shown in FIG. 8C. Thereafter, various process steps are performed, such as reoxidation of the source and drain regions 178 and 179, spacer formation, and other subsequent processing as readily known to one skilled in the art.

Figure 9A:
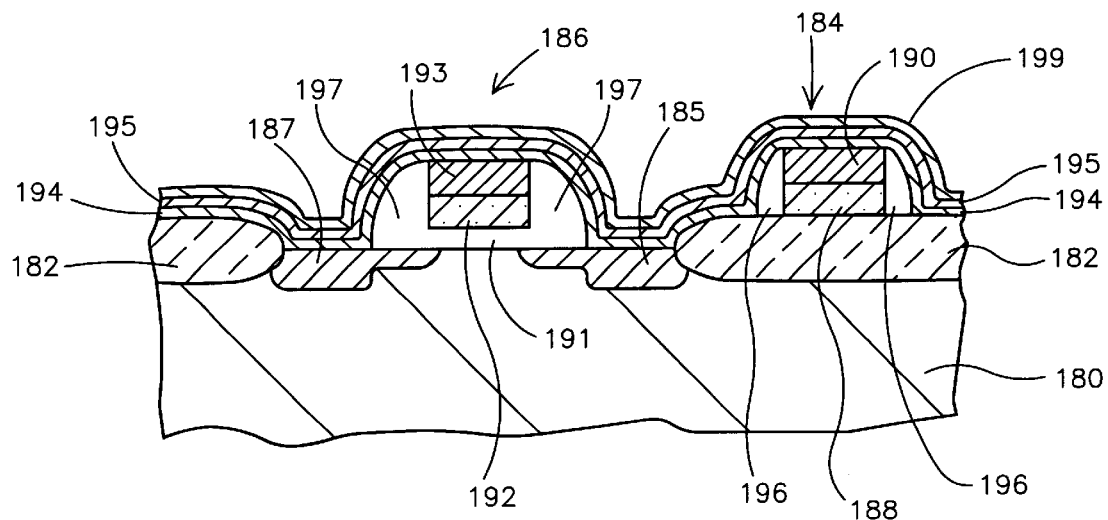
FIGS. 9A and 9B are illustrative diagrams showing use of the present invention in fabrication of a local interconnect.
Figure 9B:
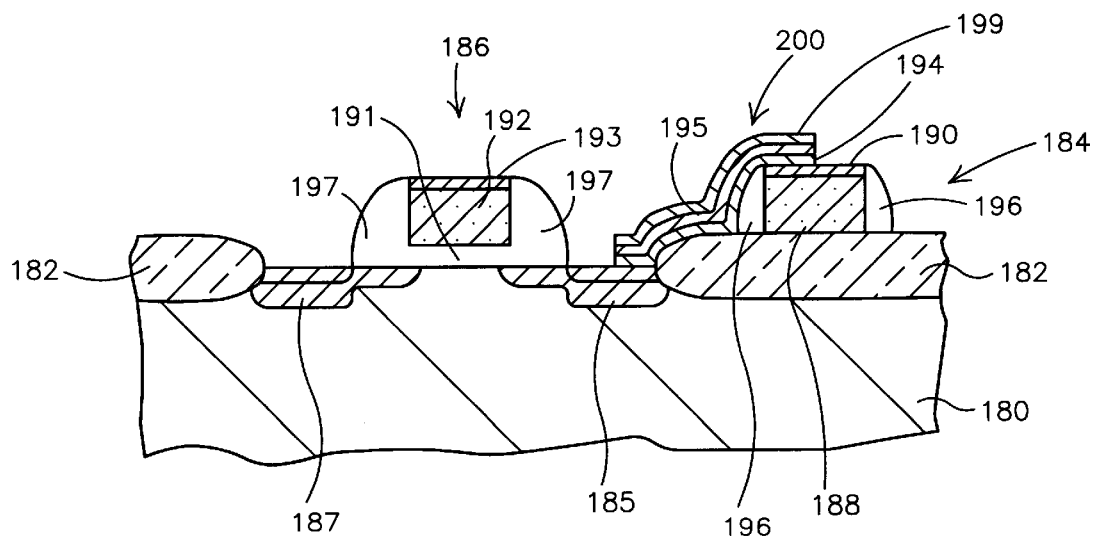

FIGS. 9A and 9B illustrate fabrication of a local interconnect such as for an SRAM device. FIG. 9A shows field oxide regions 182 formed on substrate 180 isolating an active area wherein source region 187 and drain region 18 are formed such as by implantation after formation of gate structure 186. The gate structure 186 includes polysilicon region 192 and metal silicide region 193 of the gate electrode, and further includes spacers 197 and gate oxide 191. A conductive line 184 is also formed including polysilicon region 188 and metal silicide region 190 with spacers 196 formed at the sides thereof. At the surface of this particular structure, a local interconnect 200 (FIG. 9B) is formed for connecting the drain 185 to the line 184.

As shown in FIG. 9A, a polysilicon layer 194 is formed over the various device structures. Thereafter, a barrier layer 195 is formed over the polysilicon layer 194 and titanium boride layer 199 is formed over the barrier layer 195. Photolithography is utilized to pattern the polysilicon layer 194, the barrier layer 195, and the titanium boride layer 199 resulting in the local interconnect 200 as shown in FIG. 9B connecting the drain 185 to the line 184.

It is readily apparent that the local interconnect can be formed to connect various elements of the structure of a device and that the present invention is in no manner limited to the illustration shown in FIGS. 9A–9B. For example, a local interconnect may be made between various regions of one or more device structures, e.g., connection of a source and drain of a pair of transistors.

The above two illustrations were described with use of all the optional layers being used as shown in FIGS. 1 and 2. The stacks shown and used in the other embodiments as shown in FIGS. 3–5 could also have been used as should be readily apparent.

Although the invention has been described above with particular reference to various embodiments thereof, variations and modifications of the present invention can be made within a contemplated scope of the following claims.

What is claimed is:

1. A gate electrode structure, comprising:

a substrate assembly;

a gate oxide region formed on the substrate assembly;

a region consisting essentially of titanium boride formed on the gate oxide region; and a cap region formed on the titanium boride region.

2. The structure of claim 1, further comprising a polysilicon region formed between the gate oxide region and the titanium boride region.

3. The structure of claim 2, further comprising a barrier region formed between the polysilicon region and the titanium boride region, wherein the barrier region is formed of at least one of a refractory silicide and a refractory nitride.

4. The structure of claim 1, further comprising a barrier region formed between the gate oxide region and the titanium boride region, wherein the barrier region is formed of at least one of a refractory silicide and a refractory nitride.

5. The structure of claim 1, wherein the titanium boride region consists essentially of titanium diboride.

6. The structure of claim 3, wherein the barrier region includes at least one of tungsten silicide, titanium nitride, tungsten nitride, tantalum nitride, and WSiN.

7. A gate electrode structure comprising:

a gate oxide region;

a region consisting essentially of titanium diboride on the gate oxide region; and an insulator cap region on the titanium diboride region.

8. The structure of claim 7, further comprising a barrier region formed between the gate oxide region and the titanium diboride region, wherein the barrier region includes at least one of a refractory silicide and a refractory nitride.

9. The structure of claim 7, further comprising a polysilicon region formed between the gate oxide region and the titanium diboride region.

10. The structure of claim 9, further comprising a polysilicon region formed on the gate oxide region and a barrier region formed between the polysilicon region and the titanium diboride region, wherein the barrier region includes at least one of a refractory silicide and a refractory nitride.

11. The structure of claim 10, wherein the barrier region includes at least one of tungsten silicide, titanium nitride, tungsten nitride, tantalum nitride, and WSiN.

\* \* \* \* \*

UNITED STATES PATENT AND TRADEMARK OFFICE
CERTIFICATE OF CORRECTION

PATENT NO. : 6,541,830 B1  Page 1 of 1
DATED : April 1, 2003
INVENTOR(S) : Ravi Iyer It is certified that error appears in the above-identified patent and that said Letters Patent is hereby corrected as shown below:

Column 5,
Line 8, please delete "MN" and insert -- WN --;

Column 7,
Line 36, please delete "resitivity" and insert -- resistivity --;

Column 8,
Line 7, please delete "pas" and insert -- gas --.

Signed and Sealed this

Thirteenth Day of May, 2003

JAMES E. ROGAN
*Director of the United States Patent and Trademark Office*